(12) United States Patent
den Besten (10) Patent No.: US 12,388,689 B2
(45) Date of Patent: Aug. 12, 2025

(54) CODING MODULE FOR A TRANSCEIVER

(71) Applicant: NXP B.V., Eindhoven (NL)

(72) Inventor: Gerrit Willem den Besten, Eindhoven (NL)

(73) Assignee: NXP B.V., Eindhoven (NL)

( * ) Notice: Subject to any disclaimer, the term of this patent is extended or adjusted under 35 U.S.C. 154(b) by 74 days.

(21) Appl. No.: 18/355,041

(22) Filed: Jul. 19, 2023

(65) Prior Publication Data

US 2024/0031206 A1 Jan. 25, 2024

(30) Foreign Application Priority Data

Jul. 22, 2022 (EP) .................................... 22186555

(51) Int. Cl.
*H04L 25/49* (2006.01)
*H03M 5/12* (2006.01)

(52) U.S. Cl.
CPC .......... *H04L 25/4908* (2013.01); *H03M 5/12* (2013.01)

(58) Field of Classification Search
CPC ... H04L 25/4908; H04L 1/0042; H04L 27/38; H03M 5/12; H04B 1/40
USPC .......................................... 375/219–220, 295
See application file for complete search history.

(56) References Cited

U.S. PATENT DOCUMENTS

| | | | | |
|---|---|---|---|---|
| 5,784,003 A * | 7/1998 | Dahlgren | .............. | H04L 49/203 340/2.2 |
| 7,715,445 B1 * | 5/2010 | Rosselot | ............. | H04L 12/4013 370/518 |
| 8,018,357 B1 * | 9/2011 | Tsai | ........................ | H03M 5/20 370/329 |
| 2006/0132335 A1 * | 6/2006 | Kojima | ................... | H04L 25/14 341/58 |
| 2012/0324320 A1 * | 12/2012 | Terabe | .................... | G06F 11/10 375/295 |
| 2013/0287311 A1 * | 10/2013 | Furihata | ................... | G06T 9/00 382/233 |
| 2019/0268453 A1 * | 8/2019 | Yu | ......................... | H04L 69/323 |
| 2019/0334642 A1 * | 10/2019 | Pandey | ................ | H04L 7/0066 |

FOREIGN PATENT DOCUMENTS

KR 20170036245 4/2017

OTHER PUBLICATIONS

"IEEE Standard for Ethernet Amendment 5: Physical Layers Specifications and Management Parameters for 10Mb/s Operation and Associated Power Delivery over a Single Balanced Pair of Conductors"; IEEE Computer Society; IEEE Std. 802.3cg (2019).

(Continued)

*Primary Examiner* — Emmanuel Bayard (57) ABSTRACT

A coding module for a transceiver, the coding module comprising circuitry configured to:
receive transmit-data comprising a bitstream for transmission by the transceiver;
provide for 4B5B mapping of groups of four bits of the transmit-data to five bit codewords, comprising groups of five bits, for said transmission, wherein said codewords selected to represent the groups of four bits of the transmit-data comprise a predetermined mapping and are only selected from:
a) five bit codewords that comprise two zeros and three ones; and
b) five bit codewords that comprise three zeros and two ones.

20 Claims, 2 Drawing Sheets

(56) References Cited

OTHER PUBLICATIONS

"IEEE Standard for Ethernet Section Two", IEEE Draft, Dec. 1, 2021, pp. 1-818, P8023_D3PO_SECTION2, vol. 802.3dc drafts, No. D3.0, retrieved from the internet at https://grouper.ieee.org/groups/802/3/private/maint/dcballot/D3p0/P8023_D3p0_SECTION2.pdf on Dec. 1, 2021.

"Physical Coding Sublayer (PCS), Physical Medium Attachment (PMA) sublayer and baseband medium, type 10BASE-T1S", IEEE Draft, Nov. 6, 2017, pp. 1-29, 8023CG_DOP3_T1S_REVA, IEEE, Piscataway, NJ, USA, retrieved from the intern at grouper.ieee.org/groups/802/3/cg/public/Nov2017/8023cg_DOp3_T1S_revA.pdf on Nov. 6, 2017.

Widmer, A.X. et al.; "A DC-Balanced, Partitioned-Block, 8B/10B Transmission Code"; IBM J. Res. Development; vol. 27; No. 5 (1983).

\* cited by examiner

CODING MODULE FOR A TRANSCEIVER

CROSS-REFERENCE TO RELATED APPLICATIONS

This application claims priority under 35 U.S.C. § 119 to European patent application no. 22186555.3, filed Jul. 22, 2022, the contents of which are incorporated by reference herein.

FIELD

The present disclosure relates to a coding module for a transceiver, such as a wireline transceiver or, more specifically, an Ethernet transceiver. It also relates to a method and a computer readable medium

BACKGROUND

The IEEE 10BASE-T1S specification, as of July 2022, mandates to use 4B5B coding to cover both data and control (thereby leading to a 25% overhead) and differential Manchester encoding (DME) to transmit every bit (which further doubles the required rate).

SUMMARY

According to a first aspect of the present disclosure there is provided a coding module for a transceiver, the coding module comprising circuitry configured to: receive transmit-data comprising a bitstream for transmission by the Ethernet transceiver; provide for 4B5B mapping of groups of four bits of the transmit-data to five bit codewords, comprising groups of five bits, for said transmission, wherein said codewords selected to represent the groups of four bits of the transmit-data comprise a predetermined mapping and are only selected from: a) five bit codewords that comprise two zeros and three ones; and b) five bit codewords that comprise three zeros and two ones.

Providing a selection of codewords with specific properties like a) and b) may provide for a beneficial check on the data to test if code words exist or not. This may provide a simple way to determine if there are any errors on the line.

In one or more embodiments, the coding module may be a coding module for a wireline transceiver.

In one or more embodiments, the coding module may be a coding module for an Ethernet transceiver. This may be particularly beneficial, as Ethernet already uses 4656 ratio coding thereby providing for advantages without adjusting the fundamentals of the system.

In one or more embodiments, the circuitry may further be configured to: receive control information for transmission by the Ethernet transceiver; provide for mapping of the control information to predetermined groups of five bits for said transmission, using the predetermined mapping, wherein said groups of five bit codewords selected to represent the control information are selected from: a) five bit codewords that comprise two consecutive zeros and include three consecutive ones; and b) five bit codewords that comprise two consecutive ones and include three consecutive zeros.

In one or more embodiments, the circuitry and predetermined mapping may be configured to provide for transmission of the control information by generating at least two five bit codewords, wherein a first of the at least two five bit codewords is selected from: a) five bit codewords that comprise two consecutive zeros and include three consecutive ones; and b) five bit codewords that comprise two consecutive ones and include three consecutive zeros; and a second of the at least two five bit codewords is selected from:
  a) five bit codewords that comprise two consecutive zeros and include three consecutive ones; and
  b) five bit codewords that comprise two consecutive ones and include three consecutive zeros
  c) five bit codewords that comprise two zeros and three ones; and
  d) five bit codewords that comprise three zeros and two ones.

That is, the second codeword may be a control word or it might be a different codeword. It will be appreciated here that "selected from" means that the five bit codewords are only selected from the listed options.

In one or more embodiments, the circuitry and predetermined mapping may be configured to provide for transmission of the control information by generating at least two five bit codewords, wherein a first of the at least two five bit codewords is selected from:
  a) five bit codewords that comprise two consecutive zeros and include three consecutive ones; and
  b) five bit codewords that comprise two consecutive ones and include three consecutive zeros; and
a second of the at least two five bit codewords is selected from:
  a) five bit codewords that comprise two zeros and three ones; and
  b) five bit codewords that comprise three zeros and two ones.

In one or more embodiments, the circuitry may further be configured such that the predetermined mapping excludes the use of one or more of:
  five bit codewords that comprise four zeros;
  five bit codewords that comprise four ones;
  a five bit codeword that comprises five zeros; and
  a five bit codeword that comprise five ones.

In one or more embodiments, the circuitry may be further configured such that the transmission of one or more of:
  five bit codewords that comprise four zeros;
  five bit codewords that comprise four ones;
  a five bit codeword that comprises five zeros; and
  a five bit codeword that comprises five ones
on a network creates a fault condition.

In one or more embodiments, the system may be configured, outside of the normal mapping for data transmission, to use codewords that belong to the set comprising: five bit codewords that comprise four zeros; five bit codewords that comprise four ones; a five bit codeword that comprises five zeros; and a five bit codeword that comprises five ones. The use of such a codeword may not transmit data and, instead, may be configured to intentionally trigger an fault conditions or error. This may be performed for diagnostic purposes or other purposes. It will further be appreciated that, at times, the system may unintentionally send a codeword that does belong to the list of fault-inducing codewords. This may result from an error in the system, as a result of signal degradation or another undesirable process.

In one or more embodiments, the coding module may be configured to provide encoded-data to a pulse generator configured to provide for the transmission by the Ethernet transceiver, wherein the encoded-data comprises a stream of said five bit codewords without further encoding.

Thus, in one or more examples, the coding module does not perform differential Manchester encoding.

In one or more embodiments, the five bit codewords selected to represent a respective one of each of the groups of four bits of the transmit-data may be predetermined and selected from: 00101, 11010, 00110, 11001, 01001, 10110, 01010, 10101, 01100, 10011, 10001, 01110, 10010, 01101, 10100, and 01011.

In one or more embodiments, the circuitry may be configured to:
  receive receive-data comprising data received by the Ethernet transceiver from a network;
  provide for 4B5B de-mapping of five-bit codewords in the receive-data to generate groups of four bits using the predetermined mapping.

In one or more embodiments, the coding module may be configured to be switchable between a 4B5B-mapping-mode and a 8B10B-mapping-mode, wherein the 4B5B-mapping-mode comprises the provision of said 4B5B mapping using the predetermined mapping, and wherein the 8B10B-mapping-mode comprises the coding module being configured to alternately provide for 8B10B mapping of groups of eight bits of the transmit-data to ten-bit codewords, comprising groups of ten bits, based on a predetermined 8B10B mapping.

According to a second aspect of the present disclosure, there is provided a physical layer module for implementation of 10BASE-T1S including the coding module of the first aspect.

According to a third aspect of the present disclosure, there is provided a method of operating a coding module for an Ethernet transceiver, method comprising:
  receiving transmit-data comprising data content of one or more messages for transmission by the Ethernet transceiver;
  providing for 4B5B mapping of groups of four bits of the transmit-data to groups of five bits for said transmission, wherein said groups of five bits selected to represent the groups of four bits of the transmit-data are predetermined and selected from:
    a) five bit code words that comprise two zeros and three ones; and
    b) five bit code words that comprise three zeros and two ones.

In one or more embodiments, the method may include:
  receiving control information for transmission by the Ethernet transceiver;
  providing for mapping of the control information to predetermined groups of five bits for said transmission, using the predetermined mapping, wherein said groups of five bit codewords selected to represent the control information are selected from:
    a) five bit codewords that comprise two consecutive zeros and include three consecutive ones; and
    b) five bit codewords that comprise two consecutive ones and include three consecutive zeros.

In one or more embodiments, the method may include:
  providing for transmission of the control information by generating at least two five bit codewords, wherein a first of the at least two five-bit codewords is selected from:
    a) five bit codewords that comprise two zeros and include three consecutive ones; and
    b) five bit codewords that comprise two ones and include three consecutive zeros; and
  a second of the at least two five bit codewords is selected from:
    a) five bit codewords that comprise two zeros and include three consecutive ones; and
    b) five bit codewords that comprise two ones and include three consecutive zeros
    c) five bit codewords that comprise two zeros and three ones; and
    d) five bit codewords that comprise three zeros and two ones.

In one or more embodiments, the five bit codewords selected to represent a respective one of each of the groups of four bits of the transmit-data may be predetermined and selected from: 00101, 11010, 00110, 11001, 01001, 10110, 01010, 10101, 01100, 10011, 10001, 01110, 10010, 01101, 10100, and 01011.

In one or more embodiments, the method may include:
  receiving receive-data comprising data received by the Ethernet transceiver from a network;
  providing for 4B5B de-mapping of five-bit codewords in the receive-data to generate groups of four bits using the predetermined mapping.

According to a fourth aspect of the present disclosure, there is provided a non-transient machine or computer usable media comprising computer program code configured to implement the method of the third aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

While much of the focus in recent Ethernet development has centred on high data rates, not every application requires speeds of up to 400 Gbps. For some applications, including Internet of Things (IoT), industrial and automotive, around 10 Mbps is sufficient. Factors like cost, weight, distance and the space required for cable are more important for these use cases.

Recognizing these evolving requirements, IEEE began work in early 2017 to define IEEE 802.3cg, a standard for single-pair Ethernet that supports 10 Mbps. The goals of IEEE 802.3cg were to define a point-to-point and a multi-drop short-distance standard with a maximum length of 25 meters, and a long-distance point-to-point standard that supports distances up to 1,000 meters. The resulting IEEE 802.3cg specification includes two physical-layer standards: and 10BASE-T1L.

The 10BASE-T1S short-range standard is primarily targeted at automotive and industrial applications. Multiple nodes on the network can share a cable in half-duplex shared-medium mode (multidrop mode) using the standard Ethernet Carrier-Sense Multiple Access with Collision Detection (CSMA/CD) access method and optionally additionally uses PHY-Level Collision Avoidance (PLCA). The cable is an unshielded twisted pair (UTP) that may have multiple medium dependent interfaces (MDIs) attached thereto. As such, 10BASE-T1S may also be referred to as Multidrop Single Pair Ethernet (MSPE).

The 10BASE-T1L long-range option is designed for IoT and industrial control applications. The 1,000-meter range is sufficient for use in large factories or warehouses, and 10 Mbps is sufficient for gathering data from sensors and to monitor and control many types of industrial machinery. It shares the advantages of the short network variant: compatibility with a standard Ethernet network by reusing all layers except the PHY(sical)-layer, and the single-pair PHYs provide considerable benefit over four-pair Ethernet regarding cost, weight and required space. For multi-drop 10BASE-T1S and additional benefit is that that it reduces the required number of Ethernet ports on switch and processor products, because there is only one port needed to connect with several other devices, in contrast to point-to-point Ethernet PHYs that require more than one port to build a network that connects more than two nodes.

Figure 1:
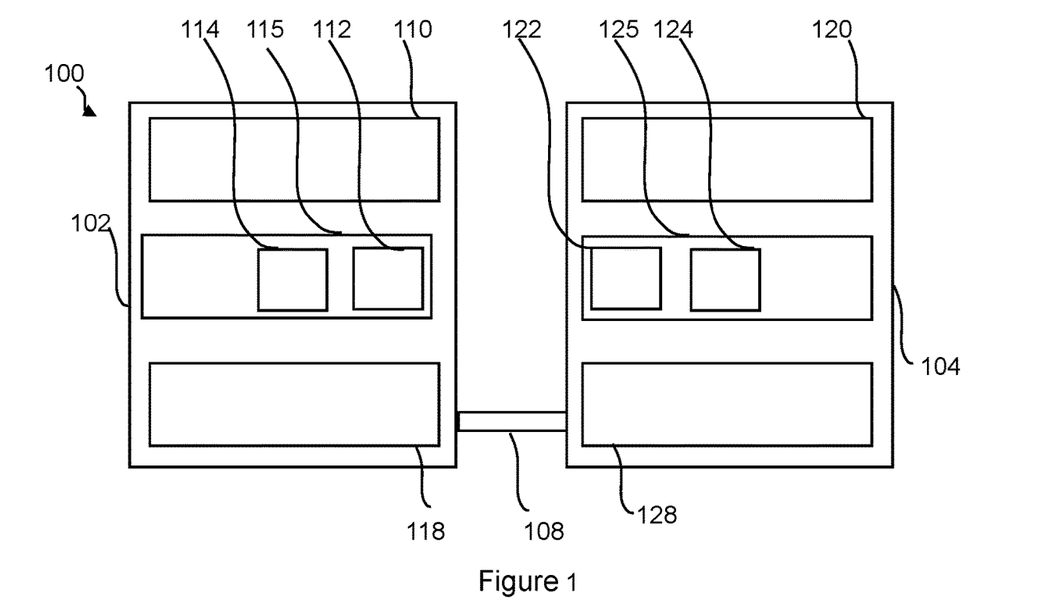
FIG. 1 illustrates a schematic block diagram of a system comprising a first node and a second node coupled by an Ethernet network that may be used to demonstrate the implementation of the 10BASE-T1S protocol.

FIG. 1 illustrates a schematic block diagram of a system 100 that illustrates the implementation of the 10BASE-T1S protocol. The system 100 comprises a first node 102 and a second node 104 connected by wire harness 108 or more generally a network, which may be provided, at least in part, by a twisted pair of cables, a coaxial cable, a bus or another appropriate means of transmission, for example.

Each node 102, 104 comprises an Ethernet stack including an Ethernet MAC 110, 120, a coding module 115, 125 (known in the art as a so called digPHY entity) and a "PMA transceiver" 118, 128. Each coding module 115, 125 provides various encoding or decoding functions as defined for the PCS Layer in IEEE802.3cg.

While the implementation of the present disclosure is described regularly herein with reference to Ethernet transceivers, it will be appreciated that the system may equally be applied to any appropriate wireline transceiver. For example, strictly, Ethernet may often refer to systems which are fully standards compliant and, as such, non-Ethernet transceivers may be utilised which utilise the same or similar technical specifications but do not adhere to all such standards; the present disclosure may be applied to such transceivers.

For example, when the first node 102 is acting as a transmitter and the second node 104 is acting as a receiver, the transmitter node coding module 115 (the coding module acting as an encoder) comprises a 4B5B encoder 112, a Differential Manchester Encoding (DME) encoder 114 to provide a signal for the PMA transceiver 118 of the first node 102. Similarly, when the second node 104 is acting as a receiver, the receiver node coding module 125 (the coding module acting as a decoder) comprises a DME decoder 124 and a 4B5B decoder 122.

A data path from the Ethernet MAC 110 of the first node 102 to the Ethernet MAC 120 of the second node 104 will be described. The data path passes sequentially from the transmit Ethernet MAC 110 to the transmit coding module 115, passing through the 4B5B encoder 112, the DME encoder 114 and the pulse encoder 116, to the transmit PMA transceiver 118. The transmit PMA transceiver 118 provides the signal for transmission on the wire harness 108, or network line, from the first node 102 to the second node 104 where it is received by the receive PMA transceiver 128. In the second node 104, the data path passes from the receive PMA transceiver 128 to the receive coding module 125, passing through the de-pulse stage 126, the DME decoder 124 and the 4B5B decoder 122, to the receive Ethernet MAC 120.

Some aspects of the present disclosure are directed to aspects of the operation of the coding module 115, 125. More generally, aspects of the present disclosure are directed to aspects of the operation of the encoding (and therefore decoding) of signalling in the first and second nodes 102, 104. The operation of the coding module which are proposed may deviate from the IEEE 802.3cg standard, as of July 2022.

As explained with reference to FIG. 1, the 10BASE-T1S standard used a 4B5B code-scheme followed by Differential Manchester Encoding (DME) which makes the lines switch at 25 MHz while effectively only sending 10 Mbps data. The 4B5B coding selected for the 10BASE-T1S standard does not provide DC-balance and therefore the further encoding with DME ensures DC balance and guarantees sufficient edges for timing purposes. This encoding process has some advantages as Ethernet typically uses a 25 MHz reference clock.

However, the effective coding overhead is a factor of 2.5×, which may be considered a significant penalty to accomplish DC-balance and enable the use of escape codes. Thus, in summary, the current code-scheme uses a relatively large amount of bandwidth to send just 10 Mbps.

If the bandwidth required for 10BASE-T1S can be reduced without substantial change to the overall concept, that could allow more flexibility in topology and/or enable an increase to a higher bus speed.

We disclose, in one or more embodiments, a coding module that reduces the coding overhead, while preserving sufficiently good DC-balance. Further, in one or more embodiments, with an appropriate code-scheme, the ability to provide AC-coupling and Power-over-Data-Line can be maintained.

Figure 2:
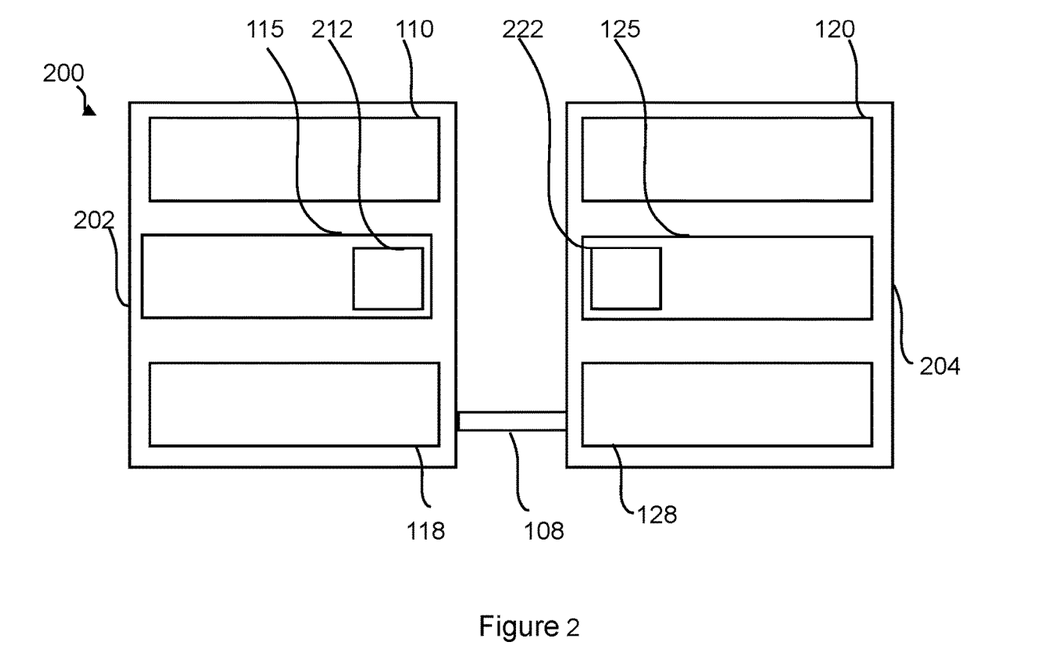
FIG. 2 shows a schematic block diagram showing an example embodiment.

FIG. 2 shows an embodiment of the present disclosure and uses the same reference numerals for like parts as shown in FIG. 1. In summary, instead of using a cascaded coding scheme, that is a 4B5B encoder 112 followed by DME encoder 114 (and likewise a DME decoder 124 followed by a 4B5B decoder 122), we disclose a single coding module (in FIG. 2) that provides the desired properties but with reduced coding overhead. It will further be appreciated that such a system may comprise more than two encoders and more than two decoders and that the provided example is for illustrative purposes only. Further, while the first node 102 is shown comprising transmitter components and the second node 104 is shown comprising receiver components, it will be appreciated that the first node may further comprise receiver components and that the second node may comprise transmitter components. In this way, each of the first node and the second node may be able to communicate in a two-way manner. In some examples, more than two nodes may be configured to communicate with each other using the same system. In such examples, the nodes may be coupled as described or may be coupled via a bus.

FIG. 2 shows a coding module 212, 222 for an Ethernet transceiver that forms part of a first node 202 and a second node 204. The coding module 212, 222 comprises circuitry configured to receive transmit-data, which may comprise content of one or more messages for transmission by the Ethernet transceiver of the first node 202. The transmit-data may be received from the Ethernet MAC 110, 120.

The coding module 212, 222 is configured to provide for 4B5B mapping of groups of four bits of the transmit-data (known as nibbles) to five bit codewords comprising groups of five bits. The codewords may then be transmitted. Thus, a plurality of the generated five-bit codewords may be concatenated to form a bitstream which is then transmitted to the network by the transceiver.

The codewords selected to represent all the combinations of four bits that may be present in the transmit-data are determined by a predetermined mapping. It will be appreciated that the predetermined mapping uses a subset of all the combinations of five bits. Thus, the subset is only selected from:
  a) five bit codewords that comprise two zeros and three ones; and
  b) five bit codewords that comprise three zeros and two ones.

That is, each and every five bit code word selected to represent all four bits are selected from five bit codewords that comprise two zeros and three ones; and five bit codewords that comprise three zeros and two ones.

It is not the concern of this disclosure exactly which particular group of four bits is mapped to which particular group of five bits. However, the selection of the subset which defines which five bit codewords are used to represent the transmit-data may be selected advantageously in one or more examples.

In one or more examples, the coding module 212 implementing the predetermined mapping (whether acting as one or both of an encoder or decoder) allows for:
  Sufficiently good DC-balance properties for AC-coupling and the potential to add Power over Data Line capability (PoDL);
  "Escape" symbols which are not part of the data set and can be used to represent control information used for administration of the network of which the transceiver forms part;
  Time synchronization.

Currently 10BASE-T1S coding is nibble-based (4-bit data units) and the currently standardized 4B5B code scheme (as of July 2022) implies 25% overhead. The DME adds another factor two to that, making the total of 1.25*2=2.5×.

Even though there might be coding options with even less overhead and still providing the desired code features, the embodiments described herein may be attractive if they maintain the 25% coding overhead of the existing 4B5B encoding, for reasons of design-compatibility, but with modification. In particular, the coding module 212, 222 of the present example uses a predetermined mapping that does obviate the need for further DME encoding and thus in the embodiment of FIG. 2, the DME encoder 114, 124 is absent and may be considered unnecessary.

The 4B5B mapping of the 10BASE-T1S standard (as of July 2022) does not have good DC-balance properties. Although the standard mandates scrambling of data, this only reduces the chance of large DC-imbalance, but doesn't prohibit it, except in the limit on a very long time-scale.

It will be appreciated that a group of four bits may exist in $2^4=16$ combinations. A codeword comprising a group of five bits can exist in $2^5=32$ combinations. Thus, with a 1:1 predetermined mapping of the groups of four bits to the five bit codewords only a subset of 16 of the 32 five bit codewords are required to represent any combination of four bits.

The total set of 32 code-words contains
  10 codewords containing exactly 2 ones and 3 zeros,
  10 codewords containing exactly 3 ones and 2 zero,
  5 codewords containing exactly 1 one and 4 zeros
  5 codewords containing exactly 1 zero and 4 ones
  1 codeword containing all zeros
  1 codeword containing all ones In a first example, the predetermined mapping is configured to map the 16 groups of four bits ("nibbles") to 16 of the following five bit codewords: 00101, 11010, 00110, 11001, 01001, 10110, 01010, 10101, 01100, 10011, 10001, 01110, 10010, 01101, 10100, 01011, 00011, 11100, 11000 and 00111.

In a preferred second example the predetermined mapping is configured to map the nibbles of the transmit-data in the following way. The following table lists all 32 five bit codewords and indicates which are used for which purpose:

| | | |
|---|---|---|
| Not used | 00000 | 11111 |
| Not used | 00001 | 11110 |
| | 00010 | 11101 |
| | 00100 | 11011 |
| | 01000 | 10111 |
| | 10000 | 01111 |
| Possible codewords for control information | 00011 | 11100 |
| Predetermined mapping of four bit groups of the transmit-data to the following five-bit codewords | 00101 | 11010 |
| | 00110 | 11001 |
| | 01001 | 10110 |
| | 01010 | 10101 |
| | 01100 | 10011 |
| | 10001 | 01110 |
| | 10010 | 01101 |
| | 10100 | 01011 |
| Possible codewords for control information | 11000 | 00111 |

Note that with this predetermined mapping, concatenated data words can never cause a sequence with more than four consecutive zeros or ones, ensuring sufficient edges for synchronization.

In one or more examples, and as shown in the table, it may be required to transmit control information. The control information should be distinct from the transmit-data for ease of identification. The circuitry of the coding module may therefore be further configured to receive control information for transmission by the Ethernet transceiver and provide for mapping of the control information to predetermined groups of five bits for said transmission, wherein said groups of five bits selected to represent the control information are selected from:
  a) five bit codewords that comprise two consecutive zeros and include three consecutive ones; and
  b) five bit codewords that comprise two consecutive ones and include three consecutive zeros.

Thus, the table above shows one or more of 00011, 11100, 11000, and 00111 of the possible five bit codewords being used for transmission of control information.

The control codewords may provide for escape codes, as will be known to those in the art. The control codewords used in the present embodiment may also provide 'comma-code' properties by combining codewords, that enable unique detection of boundaries between five-bit codewords, based on unique bit sequences in the stream, as will be understood by those skilled in the art.

In terms of DC balance, it has been found that predetermined mapping of the present example can maximally have +/−20% shift of balance (assuming +/−100% for all ones and all zero sequences respectively). This +/−20% only happens in cases where the transmit-data would incidentally map only to code words with two ones or only to code words with two zeros. Both are highly unlikely on a bus that utilizes data scrambling. Thus, this predetermined mapping provides for improved DC balance by roughly 5× compared to the default 4B5B code scheme used in the proposed 10BASE-T1S standard as of July 2022.

Although there are only four five bit control codewords available in this predetermined mapping, the number of control messages can be easily extended by making one or more of the control codes indicate that the codeword that follows is part of the control message, even if the subsequent codeword would otherwise designate the transmission of the transmit-data. Thus, for that second five-bit codeword, all 20 code words can potentially be used. If the second five-bit codeword is a transmit-data word (used to indicate the type of control function), this may allow the provision of a 5-bit (or even 6-bit) run-length inside the 2×5B combined word. As 5-bit and 6-bit run length do not occur for concatenated data codewords only, this enables the creation of 'comma' properties that reveal 5-bit codeword boundaries within a serial stream. Thus, coding module or Ethernet MAC may be configured to use the control codewords to signal that one or more (e.g. directly) subsequent codeword(s) designates control information. Thus, by using a control codeword followed by a codeword that would otherwise designate the transmit-data, greater flexibility in signalling of control information can be provided.

Note that the coding scheme of the IEEE 802.3cg standard (as of July 2022) does not have comma-codes, so the alternate proposed scheme described herein has more capabilities for synchronization and checking synchronization than the standard version.

Note from the table above in the sections marked "not used" that one or more of the five-bit codewords are not used by the predetermined mapping. In particular, the predetermined mapping excludes the use of one or more of:
five bit codewords that comprise four zeros—00001, 00010, 00100, 01000 and 10000;
five bit codewords that comprise four ones—11110, 11101, 11011, 10111, and 01111;
a five bit codeword that comprises five zeros—00000; and
a five bit codeword that comprise five ones—11111.

It can be noted that the unused codewords mean that they are not transmitted on the network as this would hamper DC balance. However, these codewords might be used for other purposes inside the transceiver to convey other information than data to be transmitted on the network. For example, in multi-drop bus systems like 10BASE-T1S there is an equilibrium state if none of the transceivers are driving the network, and all transceivers are in a high-impedance state. For 10BASE-T1S this maps to an analog differential-zero level in contrast to bit values 0 and 1 which map to negative and positive non-zero differential levels. This differential-zero level occurs implicitly when no transceiver drives the network because the differential terminations on the network, that are not part of the transceiver, will make existing differential voltages fade. This way the DC balance of the bus is maintained even if there is no communication. One or more of the codewords that are not used for transmission can be assigned to instruct the PMA to stop driving the network. Generally, the codewords that are not used for the transmission of packets can be used to send functional instructions from the coding layer to the PMA.

Furthermore it is possible to assign one or more 'unused codewords' to be transmitted on the network to explicitly create a fault condition. Note that such a codeword would not appear on the network in normal operation.

While the above description is from the point of view of transmission of transmit-data and, optionally, control information by the transceiver to the network, the nodes 202, 204 may also receive receive-data (and control information) from the network. Thus, the coding module 212, 222 may act as an encoder, as explained above and/or as a decoder 212, 222.

Accordingly, the coding module 212, 222 may receive receive-data comprising data received by the Ethernet transceiver from a network and provide for 4B5B de-mapping of five-bit codewords in the receive-data to generate groups of four bits using the predetermined mapping. The coding module may be configured to provide the generate groups of four bits to the Ethernet MAC 110, 120, such as via an MII interface.

Figure 3:
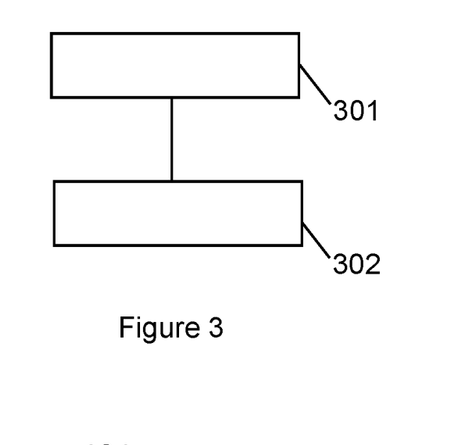
FIG. 3 illustrates an example of a method of operating a transceiver.

It can be noted that received data shall not show unused codewords in normal operation. It may show one or more specifically assigned unused codewords to enforce a fault condition. Generally, the observation of unused codewords on the network FIG. 3 shows an example method of operating a coding module for an Ethernet transceiver. The method comprises:
receiving 301 transmit-data comprising data content of one or more messages for transmission by the Ethernet transceiver;
providing 302 for 4B5B mapping of groups of four bits of the transmit-data to groups of five bits for said transmission, wherein said groups of five bits selected to represent the groups of four bits of the transmit-data are predetermined and selected from:
a) five bit code words that comprise two zeros and three ones; and
b) five bit code words that comprise three zeros and two ones.

Figure 4:
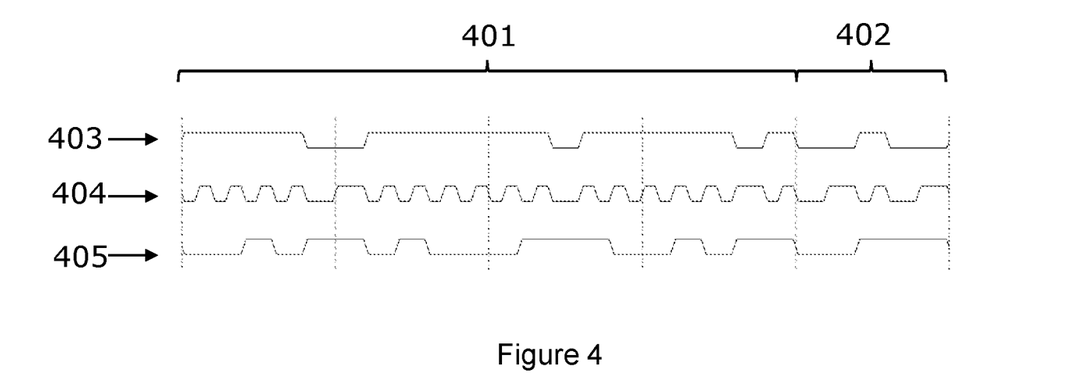
FIG. 4 illustrates a timing diagram illustrating the line code provided to the network.

FIG. 4 shows an example of the transmit-data 401 and control information 402 received by the coding module 212, 222. Trace 403 shows the example line sequence transmitted using 10BASE-T1S before DME of the prior art. Trace 404 shows the example line sequence transmitted using the current mapping and DME encoding of the prior art. Trace 405 shows an example line sequence transmitted using a predetermined mapping of the present disclosure. It can be seen that the mapped codewords are provided to the line rather than being further encoded using DME. Furthermore, the figure reveals that the signal switching rate of the proposed line sequence is substantially reduced, indicating that the proposed coding requires much less bandwidth for the same effective data rate.

Figure 5:
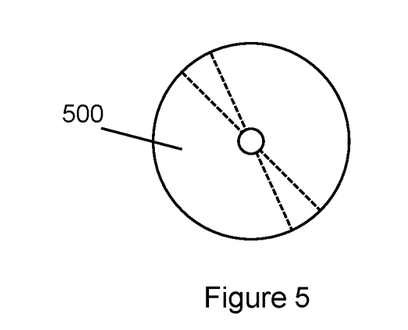
FIG. 5 illustrates a non-transitory computer-readable storage medium.

FIG. 5 shows a non-transient machine or computer-readable media 500 comprising computer program code for implementing the method and coding module described herein.

We also disclose a predetermined mapping comprising a 8B10B mapping. The 8B10B mapping will be known to those skilled in the art. It has:
Very tight DC-balance (running digital sum=1-1 at every 4B and 6B sub-symbol boundary)

Supports escape codes and comma codes

Has the same 25% coding overhead as 4B5B (but acts on two nibbles=one byte units)

In one or more examples, the coding module 115, 215 may include a 8B10B mapping mode in addition to the 4B5B mapping embodiment described herein.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are affected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A coding module for a transceiver, the coding module comprising circuitry configured to:
   receive transmit-data comprising a bitstream for transmission by the transceiver; and
   provide for 4B5B mapping of groups of four bits of the transmit-data to five bit codewords, comprising groups of five bits, for said transmission,
   wherein said codewords selected to represent the groups of four bits of the transmit-data comprise a predetermined mapping and are only selected from:
   a) five bit codewords that comprise two zeros and three ones; and
   b) five bit codewords that comprise three zeros and two ones, and
   wherein the coding module is configured to provide encoded-data to a pulse generator configured to provide for the transmission by the transceiver, wherein the encoded-data comprises a stream of said five bit codewords without further encoding.

2. The coding module of claim 1 wherein the coding module is a coding module for a wireline transceiver.

3. The coding module of claim 1 wherein the coding module is a coding module for an Ethernet transceiver.

4. The coding module of claim 1, wherein the circuitry is further configured to:
   receive control information for transmission by the transceiver;
   provide for mapping of the control information to predetermined groups of five bits for said transmission, using the predetermined mapping, wherein said groups of five bit codewords selected to represent the control information are selected from:
   a) five bit codewords that comprise two consecutive zeros and include three consecutive ones; and
   b) five bit codewords that comprise two consecutive ones and include three consecutive zeros.

5. The coding module of claim 4, wherein the circuitry and predetermined mapping is configured to provide for transmission of the control information by generating at least two five bit codewords, wherein a first of the at least two five bit codewords is selected from:
   a) five bit codewords that comprise two consecutive zeros and include three consecutive ones; and
   b) five bit codewords that comprise two consecutive ones and include three consecutive zeros; and
   a second of the at least two five bit codewords is selected from:
   a) five bit codewords that comprise two consecutive zeros and include three consecutive ones;
   b) five bit codewords that comprise two consecutive ones and include three consecutive zeros
   c) five bit codewords that comprise two zeros and three ones; and
   d) five bit codewords that comprise three zeros and two ones.

6. The coding module of claim 4, wherein the circuitry and predetermined mapping is configured to provide for transmission of the control information by generating at least two five bit codewords, wherein a first of the at least two five bit codewords is selected from:
   a) five bit codewords that comprise two consecutive zeros and include three consecutive ones; and
   b) five bit codewords that comprise two consecutive ones and include three consecutive zeros; and
   a second of the at least two five bit codewords is selected from:

a) five bit codewords that comprise two zeros and three ones; and
b) five bit codewords that comprise three zeros and two ones.

7. The coding module of claim 1, wherein the circuitry is further configured such that the predetermined mapping excludes the use of one or more of:
five bit codewords that comprise four zeros;
five bit codewords that comprise four ones;
a five bit codeword that comprises five zeros; and
a five bit codeword that comprise five ones.

8. The coding module of claim 1, wherein the circuitry is further configured such that a fault condition is created by the transmission, on a network, of one or more of:
five bit codewords that comprise four zeros;
five bit codewords that comprise four ones;
a five bit codeword that comprises five zeros; and
a five bit codeword that comprises five ones.

9. The coding module of claim 1, wherein the five bit codewords selected to represent a respective one of each of the groups of four bits of the transmit-data are predetermined and selected from: 00101, 11010, 00110, 11001, 01001, 10110, 01010, 10101, 01100, 10011, 10001, 01110, 10010, 01101, 10100, and 01011.

10. The coding module of claim 1, wherein the circuitry is configured to:
receive receive-data comprising data received by the transceiver from a network; and
provide for 4B5B de-mapping of five bit codewords in the receive-data to generate groups of four bits using the predetermined mapping.

11. The coding module of claim 1, wherein the coding module is configured to be switchable between a 4B5B-mapping-mode and a 8B10B-mapping-mode, wherein the 4B5B-mapping-mode comprises the provision of said 4B5B mapping using the predetermined mapping, and wherein the 8B10B-mapping-mode comprises the coding module being configured to alternately provide for 8B10B mapping of groups of eight bits of the transmit-data to ten-bit codewords, comprising groups of ten bits, based on a predetermined 8B10B mapping.

12. A physical layer module for implementation of 10BASE-T1S including the coding module of claim 1.

13. A method of operating a coding module for a transceiver, method comprising:
receiving transmit-data comprising data content of one or more messages for transmission by the transceiver; and
providing for 4B5B mapping of groups of four bits of the transmit-data to groups of five bits for said transmission, wherein said groups of five bits selected to represent the groups of four bits of the transmit-data are predetermined and selected from:
a) five bit code words that comprise two zeros and three ones; and
b) five bit code words that comprise three zeros and two ones; and
providing encoded-data to a pulse generator configured to provide for the transmission by the transceiver, wherein the encoded-data comprises a stream of said five bit codewords without further encoding.

14. The method of claim 13 wherein the method is a method of operating a wireline transceiver.

15. The method of claim 13, wherein the method includes:
receiving control information for transmission by the transceiver; and
providing for mapping of the control information to predetermined groups of five bits for said transmission,
using the predetermined mapping, wherein said groups of five bit codewords selected to represent the control information are selected from:
a) five bit codewords that comprise two consecutive zeros and include three consecutive ones; and
b) five bit codewords that comprise two consecutive ones and include three consecutive zeros.

16. The method of claim 15, wherein the method includes:
providing for transmission of the control information by generating at least two five bit codewords, wherein a first of the at least two five bit codewords is selected from:
a) five bit codewords that comprise two zeros and include three consecutive ones; and
b) five bit codewords that comprise two ones and include three consecutive zeros;
a second of the at least two five bit codewords is selected from:
a) five bit codewords that comprise two zeros and include three consecutive ones;
b) five bit codewords that comprise two ones and include three consecutive zeros
c) five bit codewords that comprise two zeros and three ones; and
d) five bit codewords that comprise three zeros and two ones.

17. The method of claim 15, wherein the five bit codewords selected to represent a respective one of each of the groups of four bits of the transmit-data are predetermined and selected from: 00101, 11010, 00110, 11001, 01001, 10110, 01010, 10101, 01100, 10011, 10001, 01110, 10010, 01101, 10100, and 01011.

18. The method of claim 13, wherein the method includes:
receiving receive-data comprising data received by the transceiver from a network; and
providing for 4B5B de-mapping of five bit codewords in the receive-data to generate groups of four bits using the predetermined mapping.

19. A non-transient machine or computer usable media comprising computer program code configured to implement the method of claim 13.

20. A coding module for a transceiver, the coding module comprising circuitry configured to:
receive transmit-data comprising a bitstream for transmission by the transceiver; and
provide for 4B5B mapping of groups of four bits of the transmit-data to five bit codewords, comprising groups of five bits, for said transmission,
wherein said codewords selected to represent the groups of four bits of the transmit-data comprise a predetermined mapping and are only selected from:
a) five bit codewords that comprise two zeros and three ones; and
b) five bit codewords that comprise three zeros and two ones, and
wherein the coding module is configured to be switchable between a 4B5B-mapping-mode and a 8B10B-mapping-mode, wherein the 4B5B-mapping-mode comprises the provision of said 4B5B mapping using the predetermined mapping, and wherein the 8B10B-mapping-mode comprises the coding module being configured to alternately provide for 8B10B mapping of groups of eight bits of the transmit-data to ten-bit codewords, comprising groups of ten bits, based on a predetermined 8B10B mapping.

* * * * *